United States Patent [19]

McDuff

[11] 4,330,777
[45] May 18, 1982

[54] DEVICE FOR DETECTING IMMINENT FAILURE OF HIGH-DIELECTRIC STRESS CAPACITORS

[75] Inventor: George G. McDuff, Los Alamos, N. Mex.

[73] Assignee: The United States of America as represented by the United States Department of Energy, Washington, D.C.

[21] Appl. No.: 204,121

[22] Filed: Nov. 5, 1980

[51] Int. Cl.³ ............................................. G08B 21/00
[52] U.S. Cl. .................................... 340/635; 340/661; 361/17
[58] Field of Search ...................... 340/635, 661, 653; 361/15, 16, 17, 272, 275; 324/60 C

[56] References Cited

U.S. PATENT DOCUMENTS

| | | | |
|---|---|---|---|
| 3,562,586 | 2/1971 | Carter et al. | 361/16 |
| 3,657,602 | 4/1972 | Boehm et al. | 340/635 |
| 3,735,250 | 5/1973 | Masui | 340/661 |
| 3,859,564 | 1/1975 | Zulaski | 361/17 |
| 3,984,734 | 10/1976 | Becker | 361/17 |
| 4,104,687 | 8/1978 | Zulaski | 361/17 |
| 4,219,856 | 8/1980 | Danfors et al. | 361/15 |

OTHER PUBLICATIONS

"TTL Cookbook", pp. 47, 61, 75, 91, and 111, Don Lancaster, copyright 1974, by Howard Sams & Co., Inc.

Primary Examiner—Gerald L. Brigance
Attorney, Agent, or Firm—William W. Cochran, II; Paul D. Gaetjens; Richard G. Besha

[57] ABSTRACT

A device for detecting imminent failure of a high-dielectric stress capacitor utilizing circuitry for detecting pulse width variations and pulse magnitude variations. Inexpensive microprocessor circuitry is utilized to make numerical calculations of digital data supplied by detection circuitry for comparison of pulse width data and magnitude data to determine if preselected ranges have been exceeded, thereby indicating imminent failure of a capacitor. Detection circuitry may be incorporated in transmission lines, pulse power circuitry, including laser pulse circuitry or any circuitry where capacitors or capactior banks are utilized.

8 Claims, 5 Drawing Figures

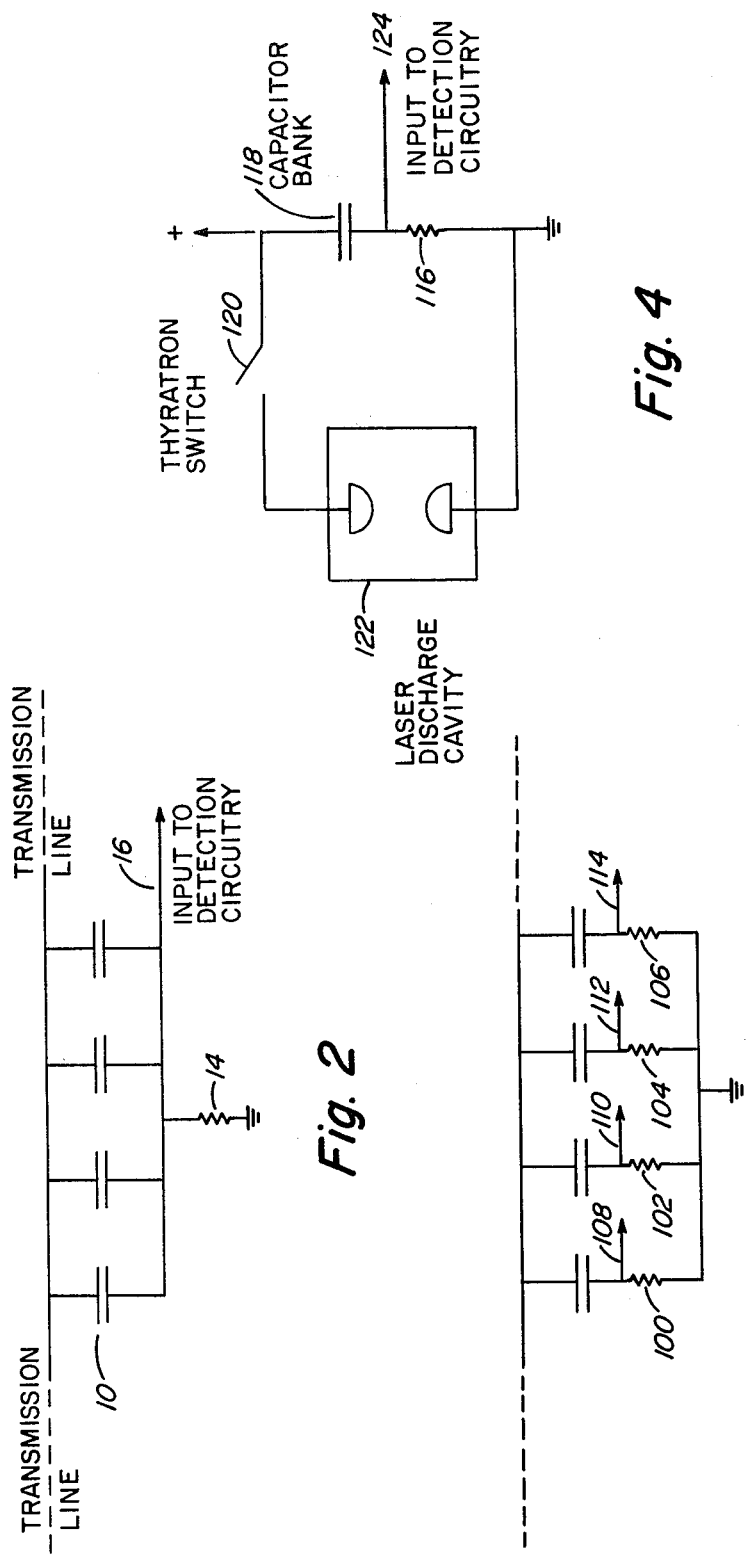

DEVICE FOR DETECTING IMMINENT FAILURE OF HIGH-DIELECTRIC STRESS CAPACITORS

BACKGROUND OF THE INVENTION

The present invention pertains generally to measuring and testing devices and more particularly to a device for detecting the imminent failure of a capacitor. This invention is the result of a contract with the Department of Energy (Contract No. W-7405-ENG-36).

High-dielectric stress capacitors are employed in many applications where reliability is an extremely important factor. For example, electric power transmission and distribution lines use capacitor banks to correct problems of power lag due to inductance effects of the transmission line. Downtime resulting from capacitor failure can be expensive, e.g. as much as $16,000 per second. Consequently, it is advantageous to know of the imminent failure of a capacitor bank under such circumstances to expedite replacement and minimize downtime and loss of profits.

Additionally, many pulse power systems utilize capacitor banks as a discharge source which also require high reliability. For example, high energy pulsed gaseous lasers such as used in molecular isotope separation systems and high energy laser fusion systems require banks of high-dielectric stress capacitors. Utilization of lasers in industrial applications necessitates high reliability of the pulse power systems to minimize downtime and maximize profits.

Although capacitors can be designed to reduce dielectric stress and consequently reduce corona inception problems and mechanical failure due to electrical stress, such capacitors are much larger than high-dielectric stress capacitors and are considerably more expensive to construct. Moreover, such capacitors are subject to eventual failure due to either the above reasons or chemical processes which occur within the capacitor. Consequently, capacitor design can not overcome the problems associated with reliablity.

SUMMARY OF THE INVENTION

It is therefore an object of the present invention to provide a device for detecting imminent failure of a high-dielectric stress capacitor.

It is also an object of the present invention to provide a device for detecting imminent failure of a high-dielectric stress capacitor which is reliable in operation.

Another object of the present invention is to provide a device for detecting imminent failure of a high-dielectric stress capacitor which is easy, simple, and inexpensive to implement.

Additional objects, advantages, and novel features of the invention are set forth in part in the description which follows, and will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purposes of the present invention, as embodied and broadly described herein, the present invention may comprise a device for detecting imminent failure of a high-dielectric stress capacitor comprising; means for applying a variable magnitude current to said capacitor, means for detecting the pulse width and magnitude of said variable magnitude current, means for comparing said pulse width and magnitude of said variable magnitude current with an average pulse width and average magnitude for a plurality of current pulses of said variable magnitude current, means for producing an alarm signal whenever said pulse width varies from said average pulse width by a first predetermined amount, means for producing an alarm signal whenever said magnitude exceeds said average magnitude by a second predetermined amount.

The present invention may also comprise, in accordance with its objects and purposes, a device for detecting imminent failure of a high-dielectric stress capacitor employed with a variable magnitude current comprising; means for sampling the current pulse width of said variable magnitude current, means for storing and averaging said current pulse width for a plurality of pulse cycles, means for comparing each current pulse width with an average current pulse width for a plurality of pulse cycles, means for producing a pulse width alarm signal whenever said current pulse width varies from said average current pulse width by more than a first predetermined amount, means for sampling said current magnitude of said variable magnitude current, means for storing and averaging said current magnitude for a plurality of pulse cycles, means for comparing each sample of said current magnitude with an average current magnitude for a plurality of cycles, means for producing a current magnitude alarm signal whenever said current magnitude exceeds said average current magnitude by more than a second predetermined amount, whereby said current magnitude alarm signal and said pulse width alarm signal indicate imminent failure of said high-dielectric stress capacitor.

The present invention is therefore capable of detecting the imminent failure of a high-dielectric stress capacitor to expedite the replacement and thereby minimize downtime of the system in which the capacitor is being utilized. In industrial applications where reliability is an extremely important factor, such a system can minimize losses and maximize profits.

The accompanying drawings, which are incorporated in, and form a part of, the specification, illustrate various embodiments of the present invention and, together with the description, serve to explain the principles of the invention.

BRIEF DESCRIPTION OF THE DRAWINGS

FIG. 2 is a schematic diagram of one embodiment for monitoring capacitors employed in a transmission line.

FIG. 3 is another embodiment for monitoring capacitors employed in a transmission line.

FIG. 4 is another embodiment for monitoring capacitors used in a laser pulse power system.

DETAILED DESCRIPTION OF THE PREFERRED EMBODIMENT OF THE INVENTION

Figure 1:
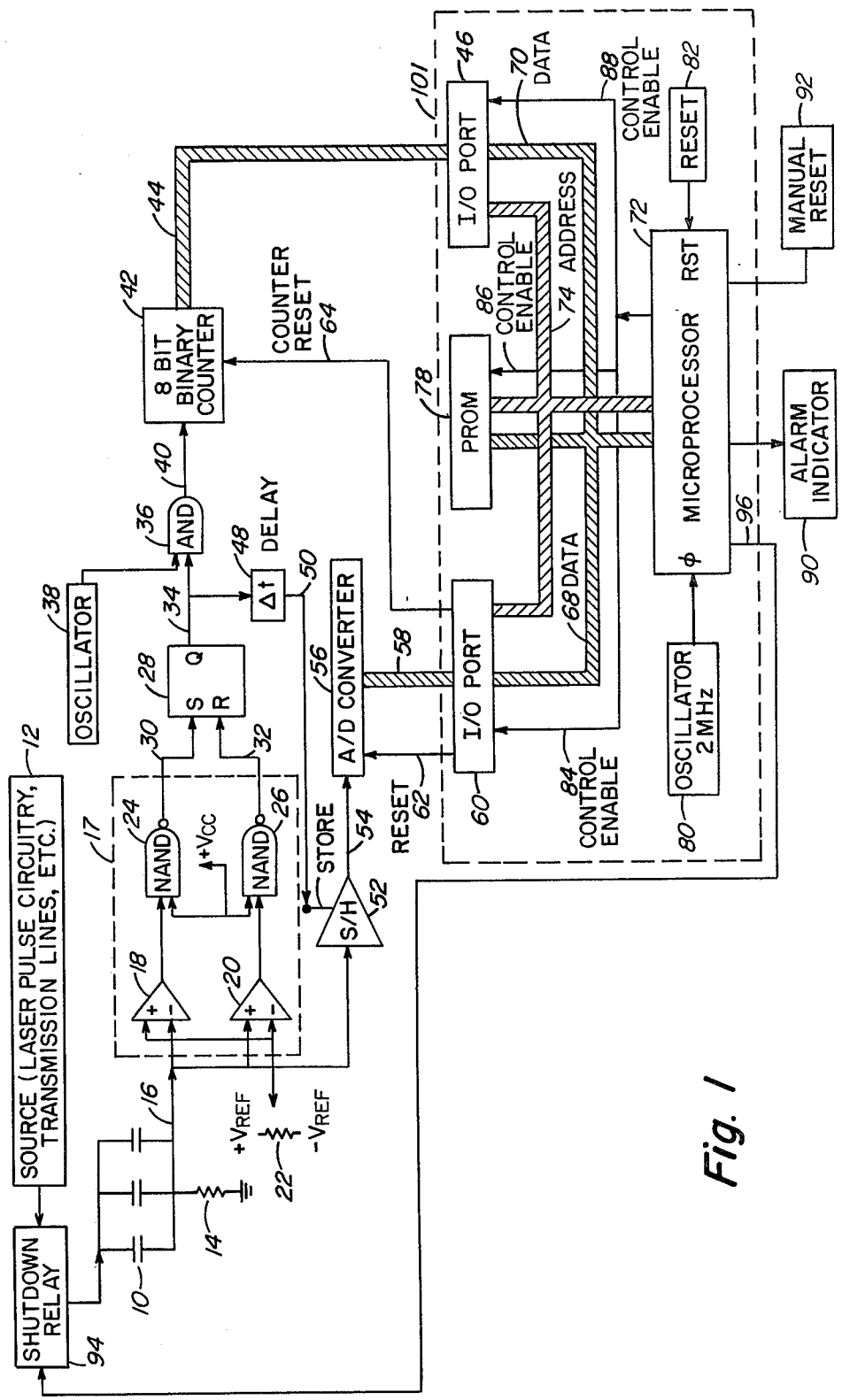
FIG. 1 is a schematic diagram of the preferred embodiment of the invention.

FIG. 1 discloses the device of the preferred embodiment of the invention. A capacitor bank 10 is implemented with a source 12, such as laser pulse circuitry, transmission lines, etc. Examples of implementation of the capacitor bank with the source are shown in FIGS. 2–4. Current viewing resistor 14 is a low resistance precision resistor connected between the capacitor bank 10 and ground. The variable magnitude current being monitored is applied via line 16 to operational amplifiers 18 and 20 of high speed comparator 17 which comprises a Signetics NE522.

Operational amplifier 20 amplifies the monitored variable magnitude current signal while operational amplifier 18 amplifies and inverts the variable magnitude current signal. A reference voltage source is applied via potentiometer 22 to the positive and negative inputs of operational amplifiers 18 and 20, respectively. In this manner, the inverted current waveform produced by operational amplifier 18 is added to the reference voltage while the noninverted current waveform produced by operational amplifier 20 is reduced by the reference voltage. The output of operational amplifier 18 is then applied to nand gate 24 while the output of operational amplifier 20 is applied to nand gate 26. A dc control voltage, $V_{cc}$, is also applied to nand gates 24 and 26. Nand gate 24 produces an output whenever either input is negative. Since $V_{cc}$ is always positive, nand gate 24 produces an output signal which sets flip flop 28 whenever the output of operational amplifier 18 is negative. Similiarly, nand gate 26 produces an output to reset the flip flop 28 whenever the output of operational amplifier 20 is negative. For positive voltage waveforms applied to operational amplifiers 18 and 20 via line 16, the voltage reference signal produced by potentiometer 22 varies the point on the waveform where the set and reset signals are produced by outputs 30 and 32. Of course, waveform variations are most prevalent at the widest point of the waveform. Consequently, the voltage reference signal is normally small compared to the peak voltage of the voltage waveform being monitored.

The output of flip flop 28 therefore constitutes a pulse having a pulse width representative of the waveform of the monitored variable magnitude current signal. The output pulse produced by flip flop 28 is then applied to and gate 36 which is clocked by a high speed oscillator 38 to produce a series of pulses at output 40 representative of the pulse width of output 34. Output 40 is applied to 8-bit binary counter 42 which counts the number of clock pulses representative of the pulse produced at output 34. This quantity is applied via 8-bit parallel data bus 44 to in/out port 46, which comprises a Mostek 3881.

The pulse produced by flip flop 28 is also applied to time delay 48 which produces a pulse at output 50 which is delayed by a predetermined interval, $\Delta t$, from the leading edge of the pulse produced at output 34. Output 50 is applied to the "store" input of sample and hold device 52 which comprises an Intersil SMH-IC-1. The store signal is delayed by a predetermined interval, $\Delta t$, so that the monitored variable magnitude current is sampled in the same location for each pulse waveform. The monitored variable magnitude current is applied to the input of sample and hold device 52 and is sampled at a predetermined location measured from the beginning of the waveform for each pulse waveform, set forth above.

The output 54, which is a signal representative of the magnitude of the monitored variable magnitude current is applied to A to D converter 56 which converts output 54 to a digital signal. A to D converter 56 produces a digital signal representative of the magnitude of the monitored variable magnitude current which is applied to in/out port 60 via 8-bit parallel data bus 58. The in/out port 60 comprises a Mostek 3881. In/out port 60 produces reset signal 62 which is applied to A to D converter 56 and counter reset signal 64 which is applied to the 8-bit binary counter which functions to reset these devices to zero once the current information has been stored.

Data stored in in/out ports 60 and 46 are applied to microprocessor 72 via data buses 68 and 70 which comprise 8-bit parallel data buses. Programmable read only memory (PROM) 78 provides the program control (set forth in FIG. 5) to control microprocessor 72 and to program address information provided by data bus 74. The 2 MHz oscillator 80 and reset device 82 also supply necessary informaton to microprocessor 72 for proper operation. The microprocessing circuitry 101, FIG. 1, comprises a Mostek Z-80 microprocessor chip available from Mostek Corporation.

Control enable signals 84, 86, and 88 are generated by microprocessor 72 to initiate operation of the device. Alarm indicator 90 produces an audible and/or visual indication of the imminent failure of a capacitor in capacitor bank 10. An automatic shutdown signal can also be produced by microprocessor 72 at output 96 which is applied to shutdown relay 94 which functions to disable application of current to the capacitor bank 10 from the source 12.

FIG. 2 is a schematic illustration of one manner of implementing the current reviewing resistor 14 with the capacitor bank 10 employed in a transmission line. Current viewing resistor 14 monitors changes in current for all of the capacitors in capacitor bank 10 via output 16.

FIG. 3 is a schematic illustration of the manner of implementing a purality of current viewing resistors 101–106. Each of the outputs 108–114 utilizes a separate circuit such as shown in FIG. 1 to monitor each of the capacitors separately, or can be combined to produce a single output. Additionally, one microprocessor chip can be used with a plurality of monitoring circuits.

FIG. 4 illustrates implementation of a current viewing resistor 116 in a pulse discharge circuit for a laser. In operation, the capacitor bank 118 is discharged through thyratron switch 120 to the laser discharge cavity 122. Current viewing resistor 116 monitors the pulse wave shape of the discharge from capacitor bank 118 via output 124, which is connected to a detection circuit, such as shown in FIG. 1.

Figure 5:
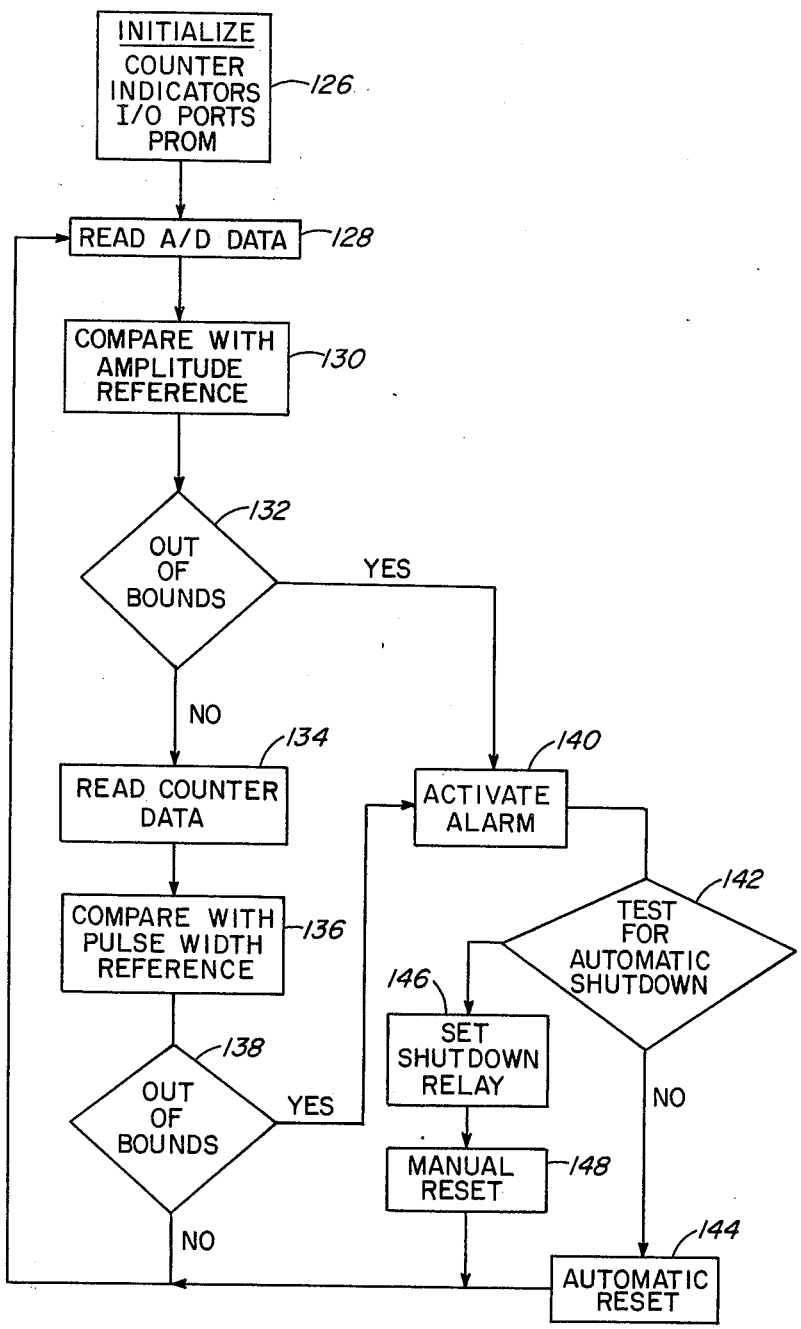
FIG. 5 is a flow diagram of the operation of the microprocessor illustrated in FIG. 1.

FIG. 5 illustrates the operation of the microprocessor unit illustrated in FIG. 1 comprising elements 60, 78, 46, 80, 72, and 82. In operation, the 8-bit binary counter 42 is initialized by counter reset 64. Similarly alarm indicator 90, in/out ports 60 and 46 and programmable read only memory 78, are all initiated by signals from microprocessor 72 as shown in block 126 of FIG. 5. Then, data is read from A to D converter 56 via in/out ports 60 by microprocessor 72. Microprocessor 72 then compares data read from the in/out port 60 with amplitude reference data stored and averaged within the microprocessor from previous reading cycles, as illustrated in block 130, FIG. 5. If the amplitude data read from A to D converter 56 and in/out port 60 falls within a predetermined range, microprocessor 72 than reads counter data supplied by 8-bit binary counter 42 via in/out port 46, as shown at block 134, FIG. 5. This counter data is then compared with pulse width reference data from previous reading cycles. As shown in block 138, FIG. 5, if the pulse width data falls within a predetermined range, the microprocessor 72 then completes the operational loop and proceeds to read A to D data from A to D converter 56 via in/out port 60, as shown at block 128.

Of course, all of the operational sequences are programmed from programmable read only memory 78. When microprocessor 72 compares amplitude reference data and determines that the data being read falls outside of the predetermined range of acceptability, the "yes" branch of block 132 is followed and alarm indicator 90 is activated as shown by operational block 140. The device then tests for automatic shutdown as shown by operational block 142. If automatic shutdown is not desired, the "no" branch is followed to operational block 144 which automatically resets the circuit and proceeds with the operational loop back to operational block 128. If it is determined, however, that automatic shutdown should proceed the "yes" branch of operational block 142 is followed and shutdown relay 94, FIG. 1, is activated as shown by operational block 146, FIG. 5.

Shutdown relay 94 disconnects the capacitor bank 10 from the current source 12 to prevent explosion of the capacitor bank 10 and possible damage to surrounding equipment. Manual reset 92, FIG. 1, can reactivate the operational loop as shown by operational block 148, FIG. 5, if it is determined that shutdown was caused by circuit transients, etc. Additionally, it may be determined that sufficient advance warning has been given and operation should proceed with a faulty capacitor bank 10 until it can be replaced. Normally the test for automatic shutdown as shown by operational block 142, FIG. 5, is a recycling of the operational loop a predetermined number of times. For example, if the test for automatic shutdown is activated a preselected number of times within a preselected time period, automatic shutdown will proceed. This avoids automatic shutdown for intermittent circuit transients which occur on transmission lines on a rather frequent basis. As a result, alarm indicators 90 are activated instantaneously, but the circuit is not shutdown due to these transient signals.

The present invention therefore provides a device which is capable of detecting imminent failure of high-dielectric stress capacitors which are employed in numerous pulse power systems, transmission lines, etc. The device is capable of testing for circuit transients and automatically shutting down operation of the capacitor bank well prior to failure and/or explosion of a faulty capacitor. Additionally, this device can be implemented with inexpensive microprocessor units which are capable of performing the many numerical calculations and comparisons required to carry out the present invention in a simple and inexpensive manner.

The foregoing description of a preferred embodiment of the invention has been presented for purposes of illustration and description. It is not intended to be exhaustive or to limit the invention to the precise form disclosed, and obviously many modifications and variations are possible in light of the above teachings. For example, source 12 can also be monitored by microprocessor 72 to detect changes in source magnitude or pulse width to prevent improper activation of alarm indicator 90. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A device for detecting imminent failure of a high-dielectric stress capacitor comprising:
    means for applying a variable magnitude current to said capacitor;
    means for detecting the pulse width and magnitude of said variable magnitude current;
    means for comparing said pulse width and magnitude of said variable magnitude current with an average pulse width and average magnitude for a plurality of current pulses of said variable magnitude current;
    means for producing an alarm signal whenever said pulse width varies from said average pulse width by a first predetermined amount;
    means for producing an alarm signal whenever said magnitude exceeds said average magnitude by a second predetermined amount.

2. The device of claim 1 wherein said first predetermined amount is approximately 0.1%.

3. The device of claim 1 wherein said second predetermined amount is approximately 5%.

4. The device of claim 1 wherein said means for applying said variable magnitude current comprises a transmission line.

5. The device of claim 1 wherein said means for applying said variable magnitude current comprises a laser system.

6. A device for detecting imminent failure of a high-dielectric stress capacitor employed with a variable magnitude current comprising:
    means for sampling the current pulse width of said variable magnitude current;
    means for storing and averaging said current pulse width for a plurality of pulse cycles;
    means for comparing each current pulse width with an average current pulse width for a plurality of pulse cycles;
    means for producing a pulse width alarm signal whenever said current pulse width varies from said average current pulse width by more than a first predetermined amount;
    means for sampling said current magnitude of said variable magnitude current;
    means for storing and averaging said current magnitude for a plurality of pulse cycles;
    means for comparing each sample of said current magnitude with an average current magnitude for a plurality of cycles;
    means for producing a current magnitude alarm signal whenever said current magnitude exceeds said average current magnitude by more than a second predetermined amount;
    whereby said current magnitude alarm signal and said pulse width alarm signal indicate imminent failure of said high-dielectric stress capacitor.

7. The device of claim 6 wherein said first predetermined amount is approximately 0.1%.

8. The device of claim 6 wherein said second predetermined amount is approximately 5%.

* * * * *